US007719840B2

(12) United States Patent
Lin et al.

(10) Patent No.: US 7,719,840 B2
(45) Date of Patent: May 18, 2010

(54) HEAT SINK ASSEMBLY HAVING A FIXING BASE THEREOF

(75) Inventors: Tong-Hua Lin, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 178 days.

(21) Appl. No.: 11/926,692

(22) Filed: Oct. 29, 2007

(65) Prior Publication Data

US 2009/0109630 A1 Apr. 30, 2009

(51) Int. Cl.
*H05K 7/20* (2006.01)

(52) U.S. Cl. .................. 361/710; 361/709; 361/679.54

(58) Field of Classification Search ................ 361/702, 361/703, 709, 710, 718, 719, 679.54; 439/487
See application file for complete search history.

(56) References Cited

U.S. PATENT DOCUMENTS 4,679,118 A * 7/1987 Johnson et al. ............ 361/718
5,241,453 A * 8/1993 Bright et al. ............... 361/704
5,302,853 A * 4/1994 Volz et al. .................. 257/707
5,660,562 A * 8/1997 Lin .......................... 439/487
6,153,932 A * 11/2000 Liang ........................ 257/712
6,195,880 B1 * 3/2001 Hinshaw et al. .............. 29/845
6,295,203 B1 9/2001 Lo
6,449,154 B1 * 9/2002 Yoneyama et al. .......... 361/704
7,142,430 B2 * 11/2006 Lee et al. .................... 361/719
7,180,746 B2 * 2/2007 Yu et al. ..................... 361/719
7,327,575 B2 * 2/2008 Yu et al. ..................... 361/719
2003/0228789 A1 * 12/2003 Chang et al. ................ 439/487
2005/0219823 A1 * 10/2005 Yu et al. ..................... 361/704
2006/0042787 A1 * 3/2006 Yu et al. ..................... 165/185
2006/0120046 A1 * 6/2006 Yu et al. ..................... 361/697
2007/0079485 A1 * 4/2007 Lin et al. ...................... 24/458
2007/0274048 A1 * 11/2007 Xia et al. .................... 361/704
2008/0084669 A1 * 4/2008 Xia et al. .................... 361/704
2008/0298013 A1 * 12/2008 Li et al. ...................... 361/688

* cited by examiner

*Primary Examiner*—Anatoly Vortman
(74) *Attorney, Agent, or Firm*—Jeffrey T. Knapp

(57) ABSTRACT

A heat sink assembly includes a fixing base and a heat sink mounted on the fixing base. The fixing base has a bottom face attached to an electronic component mounted on a printed circuit board. The fixing base includes a pair of hooks extending from a rear side thereof and engaging with a support beam fixed to the printed circuit board. A pair of sleeves extend from a front side of the fixing base and two fasteners are received in the sleeves and threadedly engage with the printed circuit board. The rear and front sides of the fixing base are firmly secured to the printed circuit board, whereby the heat sink mounted on the fixing base can dissipate heat from the electronic component via the fixing base.

13 Claims, 5 Drawing Sheets

14
10
12
260
244
246
248
262
2420
24
240
242
20
22
224
222
220
30
42
40
44
244
42
40
22
240
260
242
224
30

HEAT SINK ASSEMBLY HAVING A FIXING BASE THEREOF

BACKGROUND OF THE INVENTION

1. Field of the Invention

The present invention relates to a heat sink assembly, and particularly to a heat sink assembly having a fixing base for securing a heat sink to a heat-generating device, such as a chipset mounted on a printed circuit board.

2. Description of Related Art

It is widely acknowledged that a heat-generating device such as a chipset in a PC may generate much heat when operating; it is necessary to dissipate the heat to avoid the degradation of performance and the eventual burn-out of the chipset. Hence, a heat sink attached on the chipset to dissipate all the heat generated by the chipset is needed.

A heat sink device is commonly used for high speed chipsets. Usually, a clip assembly is used in the heat sink device for engaging with the heat sink to mount the heat sink on the chipset. An example of a clip assembly is shown in U.S. Pat. No. 6,295,203. The clip assembly includes a clip and a fastener, for securing a heat sink to an electronic component attached to a printed circuit board. The clip has an elongate spring portion engaging a surface of the heat sink and two legs extending from the spring portion for engaging with catches of the printed circuit board, thereby securing the heat sink to the electronic component. The fastener includes a pair of latches and a connecting section formed between the two latches. The heat sink has a plurality of fins defining a slot therebetween for receiving the clip and the fastener. The latches are configured to engage in grooves defined in the fins on opposite sides of the slot of the heat sink, thereby securely attaching the clip to the heat sink and effectively eliminating relative movement between the clip and the heat sink.

However, the above structure using the latches of the fastener engaging in the grooves in the heat sink is complicated and inconvenient for assembly of the clip assembly. Furthermore, the latches of the fastener may be easily detached from the fins of the heat sink when the heat sink is subjected to vibration. Finally, to form the grooves in the fins of the heat sink needs additional machining, which means additional cost.

Thus, an improved heat sink assembly which overcomes above-mentioned problems is required.

SUMMARY OF THE INVENTION

A heat sink assembly in accordance with a preferred embodiment of the present invention includes a heat sink and a fixing base for securing the heat sink to an electronic component mounted on a printed circuit board. The heat sink is mounted on a top face of the fixing base. The fixing base has a bottom face opposite to the top face thereof and attached to the electronic component. The fixing base includes a pair of hooks located at a rear side thereof and engaging with a support beam fixed above the printed circuit board to secure the rear side of the fixing base to the printed circuit board. The fixing base further includes a pair of sleeves extending from a front side thereof and two fasteners received in their respective sleeves. The fasteners of the fixing base extend through the sleeves and are threadedly fastened to the printed circuit board to secure the front side of the fixing base to the printed circuit board. Thus, the fixing base is firmly secured to the printed circuit board with the bottom face thereof having an intimate contacting with the electronic component, whereby the heat sink mounted on the top face of the fixing base can dissipate heat from the electronic component via the bottom face of the fixing base.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
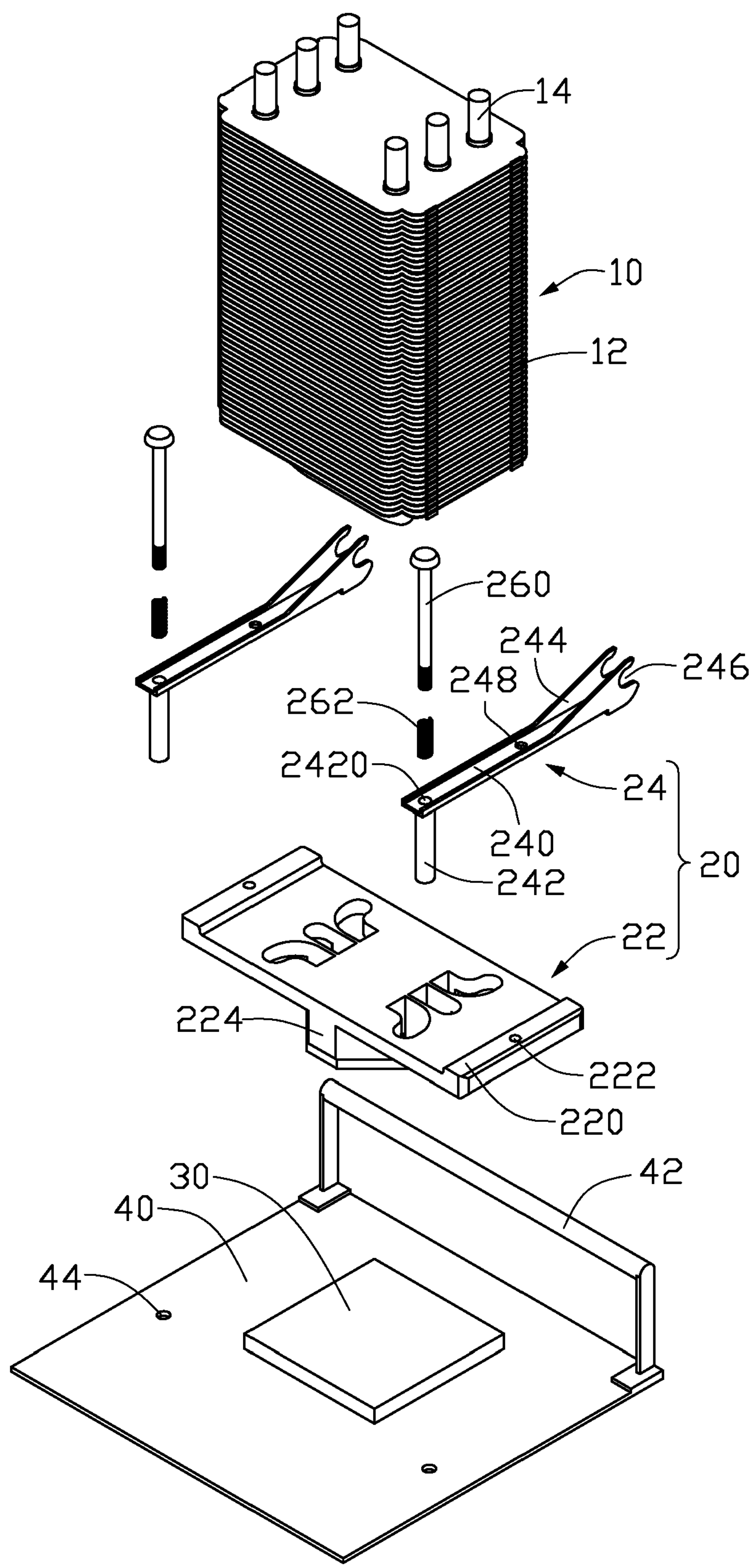
FIG. 1 is an exploded, isometric view of a heat sink assembly according to a first embodiment of the present invention, with an electronic component mounted to a printed circuit board.
Figure 2:
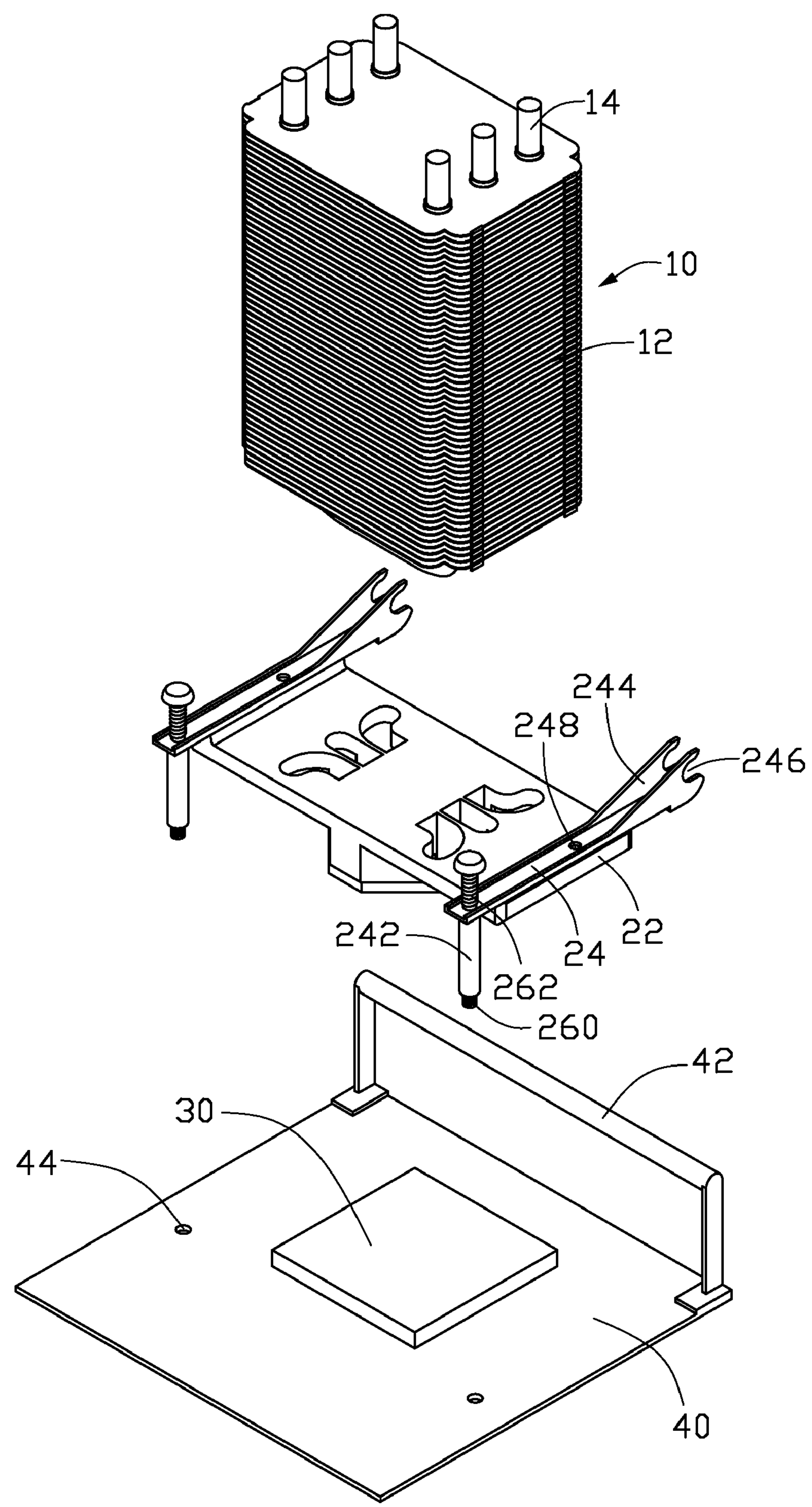
FIG. 2 is a view similar to FIG. 1, with a fixing base of the heat sink assembly being assembled together.

FIGS. 1-2 illustrate a heat sink assembly in accordance with a first embodiment of the present invention, which comprises a heat sink 10 and a fixing base 20 for securing the heat sink 10 to an electronic component 30 mounted on a printed circuit board 40. The fixing base 20 has a bottom surface (not labeled) for contacting with the electronic component 30. The heat sink 10 is mounted on a top surface (not labeled) of the fixing base 20, opposite to the bottom surface (not labeled), for dissipating heat from the electronic component 30 via the fixing base 20. The printed circuit board 40 has a support beam 42 formed from a lateral side thereof for engaging with the fixing base 20. A pair of apertures 44 are defined in the printed circuit board 40 and located near two opposite sides of the electronic component 30.

The heat sink 10 comprises a plurality of fins 12 and a plurality of heat pipes 14 curved and extending through each fin 12. The fins 12 are stacked with each other and parallel to the fixing base 20.

The fixing base 20 comprises a base 22 and a pair of clips 24 fixed on two opposite short sides of the base 22. The base 22 is rectangular-shaped and has a pair of platforms 220 extending upwardly from the two opposite short sides of the base 22. A through hole 222 is defined in a middle portion of each platform 220 of the base 22, for a pin (not shown) to extend therethrough to secure a corresponding clip 24 to a corresponding platform 220 of the base 22. A bulge 224 is extended downwardly from a middle portion of the bottom surface of the fixing base 20 for thermally contacting with the electronic device 30. Each clip 24 comprises a main body 240 and a fastener 260 engaging with the main body 240. The main body 240 of each clip 24 comprises a sleeve 242 at a front end thereof. The sleeve 242 receives a corresponding fastener 260 therein for securing the front end of the clip 24 to the printed circuit board 40. The sleeve 242 extends downwardly and perpendicularly from a bottom surface of the main body 240. The sleeve 242 has a cylindrical body (not labeled)

defining a vertical aperture 2420 therein. The main body 240 further comprises a hook 244 at a rear end opposite to the front end thereof for fastening the rear end to the support beam 42 of the printed circuit board 40. The hook 244 extends upwardly and outwardly from two opposite lateral side edges of the rear end of the main body 240 of each clip 24. The hook 244 includes a pair of parallel wings (not labeled) extending upwardly and perpendicularly from the main body 240 of the clip 24. Each wing has a fork-shaped rear end. The hook 244 defines a pair of cutouts 246 at the rear end thereof, for receiving the support beam 42 of the printed circuit board 40 therein. A positioning hole 248 is defined in a middle portion of the main body 240. The fasteners 260 each of which is surrounded by a spring 262 are received in the apertures 2420 of the sleeves 242 of the clips 24, respectively, with a bottom end of each fastener 260 being exposed outside a bottom end of a corresponding sleeve 242.

Figure 3:
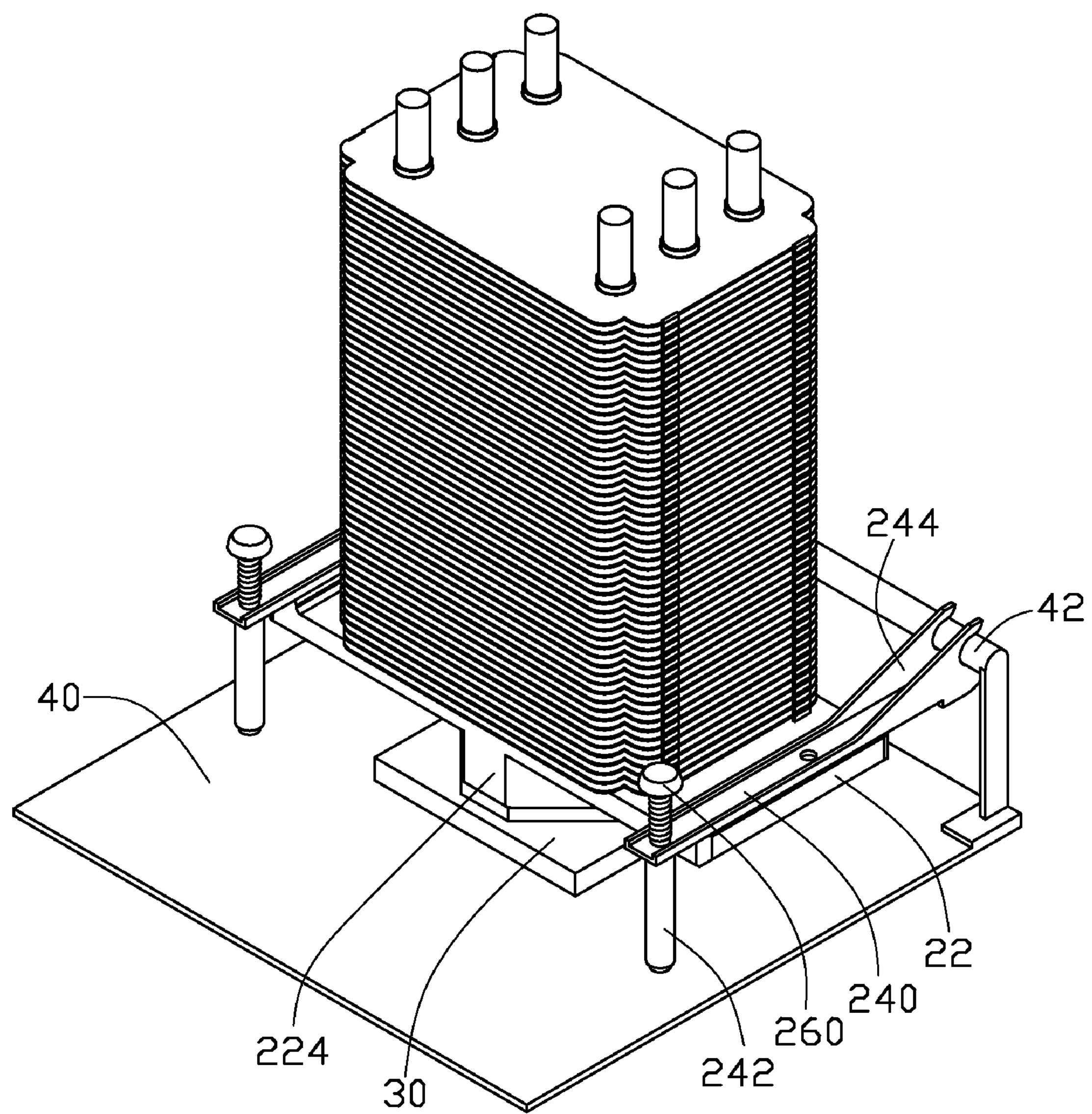
FIG. 3 is an assembled view of FIG. 1.

Referring to FIGS. 2-3, in assembly, firstly the clips 24 are fixed on the platforms 220 of the two opposite short sides of the base 22 of the fixing base 20 via the pins (not shown) extending through the positioning holes 248 of the clips 24 and secured in the through holes 222 of the base 22. The fixing base 20 rests on a top face of the printed circuit board 40, with the bottom surface of the fixing base 20 contacting with the electronic component 30. The hooks 244 of the clips 24 clamp the support beam 42 of the printed circuit board 40, with the support beam 42 being received in the cutouts 246 of the hooks 244 of the clips 24, whereby a rear long side of the base 22 of the fixing base 20 is secured in respect to the printed circuit board 40. The fasteners 260 of the fixing base 20 extend through the apertures 44 in the printed circuit board 40 and threadedly engage with fixtures (not shown) located beneath the printed circuit board 40, thereby securing a front long side of the base 22 of the fixing base 20 to the printed circuit board 40. The base 22 of the fixing base 20 is then firmly fixed to the printed circuit board 40 via the clips 24 secured to the printed circuit board 40, whereby the heat sink 10 mounted on the top surface of the fixing base 20 can be firmly secured to the top face of the printed circuit board 40 and dissipate heat from the electronic device 30 via the fixing base 20. In disassembly, firstly the fasteners 260 of the fixing base 20 are disconnected with the fixtures (not shown) to disengage from the printed circuit board 40, whereby the hooks 244 of the clips 24 can disengage from the support beam 42 of the printed circuit board 40 and then the fixing base 20 can separate from the electronic component 30.

Figure 4:
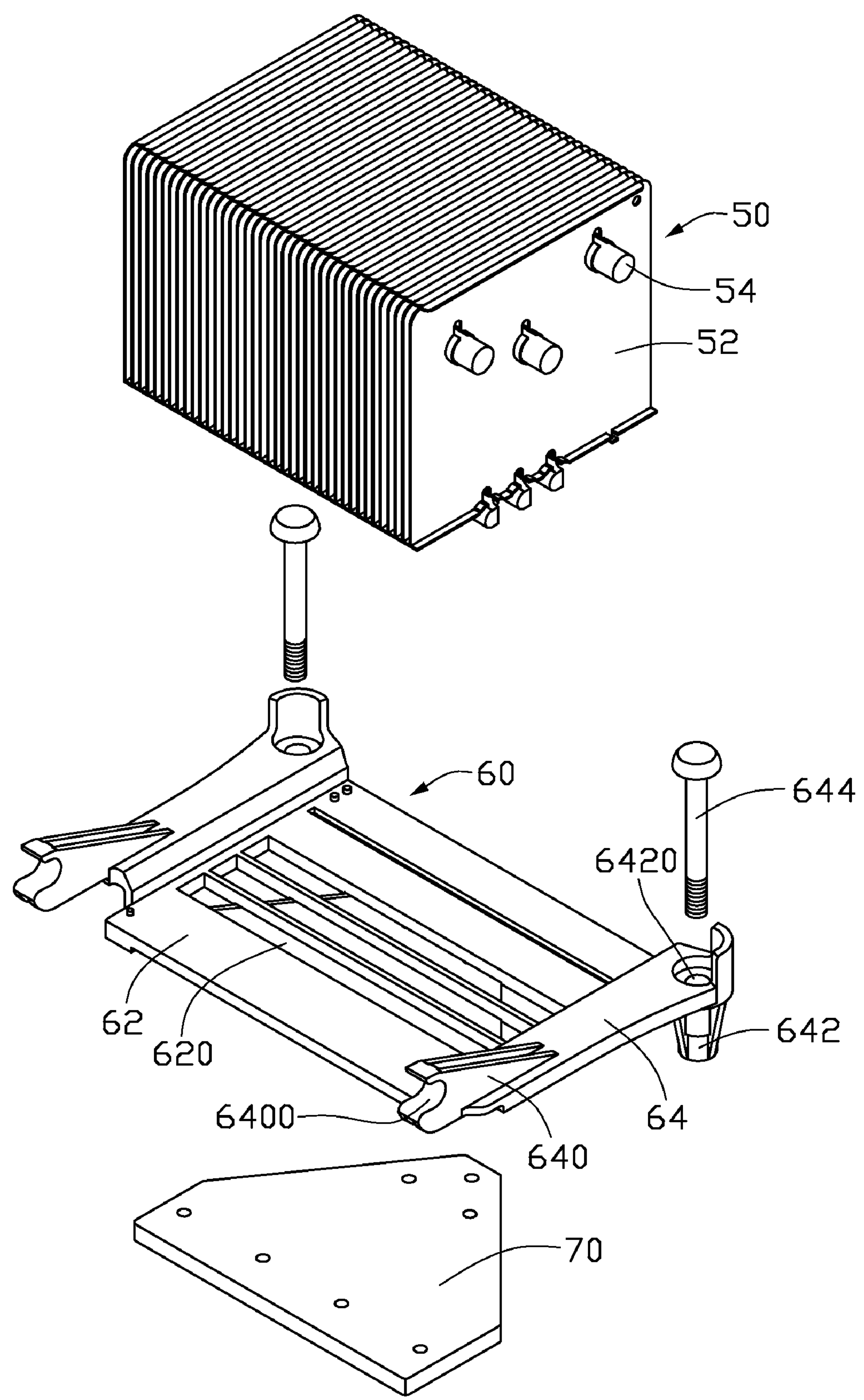
FIG. 4 is an exploded, isometric view of a heat sink assembly according to a second embodiment of the present invention.
Figure 5:
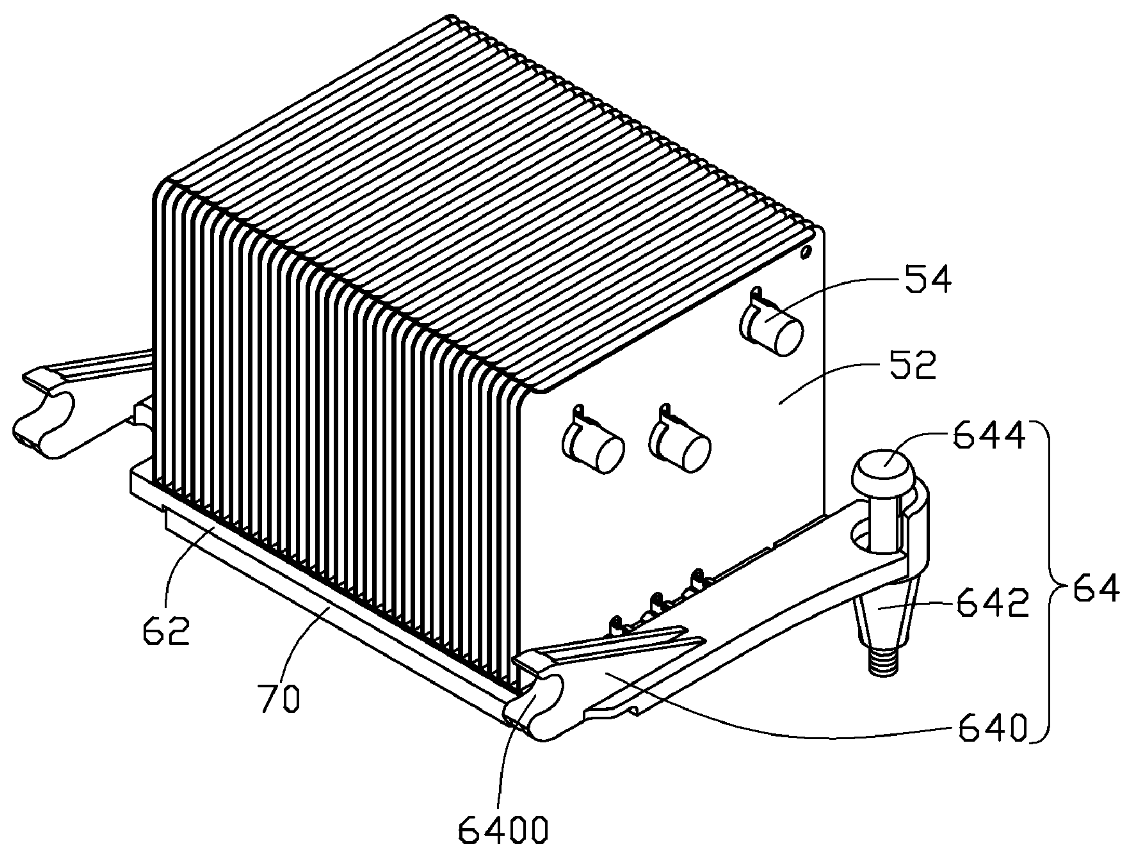
FIG. 5 is an assembled view of FIG. 4.

FIGS. 4-5 illustrate a heat sink assembly in accordance with a second embodiment of the present invention, which comprises a heat sink 50, a fixing base 60 for securing the heat sink 50 to an electronic component (not shown) mounted on a printed circuit board (not shown). The heat sink assembly in the second embodiment of the present invention further comprises a heat-conductive plate 70 attached to a bottom face (not shown) of the fixing base 60. The heat-conductive plate 70 is for contacting with the electronic component (not shown) to directly absorb heat from the electronic component. The heat sink 50 is mounted on a top face (not labeled) of the fixing base 60 and comprises a plurality of fins 52 spaced parallel to each other and a plurality of heat pipes 54 curved and extending through each fin 52. The fixing base 60 comprises a base 62 and a pair of clips 64 integrally formed with the base 62 of the fixing base 60. The base 62 has a rectangular shape and defines a plurality of grooves 620 in the top face (not labeled) thereof. The grooves 620 are provided for receiving evaporating sections (not labeled) of the heat pipes 54 therein. The clips 64 extend outwardly from two opposite short sides of the base 62. Each clip 64 comprises a hook 640 and a sleeve 642 formed at two opposite ends thereof respectively. A pair of fasteners 644 are received in the sleeves 642 respectively, for engaging with the printed circuit board to secure the base 62 of the fixing base 60 to the printed circuit board. The hook 640 extends upwardly and outwardly from a rear end of each clip 64 and has a forked shape. An arc-shaped cutout 6400 is defined in a rear end of the hook 640 for receiving therein a support beam (not shown) fixed above the printed circuit board (not shown) to thereby secure a rear long side of the fixing base 60 to the printed circuit board (not shown). The sleeve 642 extends downwardly from a front end of the clip 64 and perpendicular to the base 62 of the fixing base 60. The sleeve 642 has a frustum-like body defining an aperture 6420 for receiving a corresponding fastener 644 therein to secure a front long side of the fixing base 60 to the printed circuit board (not shown). Thus, the base 62 of the fixing base 60 can be firmly secured to the printed circuit board (not shown). The heat sink 10 which is mounted on the top surface of the fixing base 60 can accordingly be firmly secured to the top face of the printed circuit board and dissipate heat from the electronic component via the heat-conductive plate 70 and the fixing base 60.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:

a fixing base having a bottom surface attached to a heat-generating component mounted on a printed circuit board, the fixing base comprising a pair of clips at two opposite sides thereof, each clip comprising a hook extending from a first end thereof for engaging with a support beam secured to the printed circuit board, thereby securing the first end of the each clip to the printed circuit board, the each clip further comprising a sleeve extending from a second end thereof and a fastener received in the sleeve for engaging with the printed circuit board to secure the second end of the each clip to the printed circuit board; and a heat sink mounted on a top surface of the fixing base and dissipating heat from the heat-generating component via the fixing base.

2. The heat sink assembly as claimed in claim 1, wherein each hook extends outwardly from the first end of the each clip and each sleeve extends downwardly from the second end of the each clip, the first end of the each clip being opposite to the second end of the each clip.

3. The heat sink assembly as claimed in claim 2, wherein the each hook defines a cutout in a free end thereof for receiving the support beam secured to the printed circuit board therein.

4. The heat sink assembly as claimed in claim 3, wherein the fasteners of the clips each extend through a corresponding sleeve with a free end thereof exposed outside the corresponding sleeve.

5. The heat sink assembly as claimed in claim 1, wherein the fixing base comprises a base and the clips are positioned on two opposite sides of the base, the heat sink being mounted on a top face of the base.

6. The heat sink assembly as claimed in claim 5, wherein the clips each define a positioning hole therein and the base defines a pair of through holes in the two opposite sides thereof for screws to extend through the positioning holes and screw in the through holes to secure the clips on the two opposite sides of the base.

7. The heat sink assembly as claimed in claim 6, wherein each hook extends upwardly from two opposite lateral sides of the first end of the each clip.

8. The heat sink assembly as claimed in claim 7, wherein each sleeve has a cylindrical body defining a vertical aperture therein for receiving a corresponding fastener therein.

9. The heat sink assembly as claimed in claim 8, wherein the base of the fixing base comprises a pair of platforms extending from the two opposite sides thereof, the clips being fixed on the platforms of the base.

10. The heat sink assembly as claimed in claim 5, wherein the clips are integrally formed with the base of the fixing base and the clips are extended outwardly from the two opposite sides of the base.

11. A heat dissipation assembly comprising:

a printed circuit board having a support beam fixed thereto and an electronic component attached thereon, wherein the support beam is located above the electronic component;

a fixing base having a bottom face contacting with the electronic component, the fixing base comprising a pair of hooks extending from a side thereof and clamping the support beam fixed to the printed circuit board to secure the side of the fixing base to the printed circuit board, the fixing base further comprising a pair of fasteners located at an opposite side thereof and engaging with the printed circuit board to fix the opposite side of the fixing base on the printed circuit board; and a heat sink mounted on a top face of the fixing base and dissipating heat from the electronic device via the fixing base;

wherein the fixing base further comprises a pair of sleeves formed at the opposite sides thereof and each fastener is received in a corresponding sleeve with a free end thereof exposed outside of the corresponding sleeve.

12. The heat dissipation device as claimed in claim 11, wherein the fasteners of the fixing base threadedly engage with the printed circuit board.

13. The heat dissipation device as claimed in claim 12, wherein each hook has a forked shape and defines a cutout in a free end thereof, the support beam of the printed circuit board being received in the cutouts of the hooks.

* * * * *